United States Patent [19]

Kinanen

[11] Patent Number: 5,627,471
[45] Date of Patent: May 6, 1997

[54] POLE PIECE FOR MR IMAGER

[75] Inventor: Ilmari V. Kinanen, Espoo, Finland

[73] Assignee: Picker Nordstar Inc., Helsinki, Finland

[21] Appl. No.: 714,968

[22] Filed: Sep. 17, 1996

Related U.S. Application Data

[63] Continuation of Ser. No. 297,981, Aug. 30, 1994, abandoned.

[30] Foreign Application Priority Data

Sep. 1, 1993 [FI] Finland .................. 933834

[51] Int. Cl.$^6$ .................. G01R 33/20
[52] U.S. Cl. .................. 324/319; 324/320; 335/297
[58] Field of Search .................. 324/318, 319, 324/320, 322; 335/296, 297, 298, 299; 128/653.5

[56] References Cited

U.S. PATENT DOCUMENTS

| | | | |
|---|---|---|---|
| 3,223,897 | 12/1965 | Sullivan | 335/298 |
| 4,093,912 | 6/1978 | Double et al. | 324/0.5 MA |
| 4,672,346 | 6/1987 | Miyamoto et al. | 335/296 |
| 4,673,882 | 6/1987 | Buford | 324/320 |
| 4,682,111 | 7/1987 | Hughes | 324/320 |
| 4,818,966 | 4/1989 | Miyamoto et al. | 335/297 |
| 4,937,545 | 6/1990 | Chaillout et al. | 324/318 |
| 5,003,276 | 3/1991 | Sarwinski et al. | 335/304 |
| 5,194,810 | 3/1993 | Breneman et al. | 324/320 |
| 5,278,534 | 1/1994 | Abele et al. | 335/301 |
| 5,363,078 | 11/1994 | Ries et al. | 324/319 |
| 5,431,165 | 7/1995 | Sellers | 324/318 |
| 5,495,222 | 2/1996 | Abele et al. | 335/306 |

FOREIGN PATENT DOCUMENTS

| | | |
|---|---|---|
| 0192331 | 8/1986 | European Pat. Off. . |
| 0262880 | 4/1988 | European Pat. Off. . |
| 0407227 | 1/1991 | European Pat. Off. . |
| 0432750 | 6/1991 | European Pat. Off. . |
| 0488015 | 6/1992 | European Pat. Off. . |
| 3737133 | 5/1989 | Germany . |
| 0946340 | 1/1964 | United Kingdom . |
| 8400611 | 2/1984 | WIPO . |

OTHER PUBLICATIONS

Double et al, "Collar to Mechanically adjust pole face parallelism", IBM Technical Disclosure Bull. vol. 18, No. 1 (Jun. 1975).

Double, "Manual Field Adjustment for NMR Magnet" IBM Tech. Discl. Bull. vol. 20, No. 4 (Sep. 1977).

*Primary Examiner*—Sandra L. O'Shea
*Assistant Examiner*—Raymond Y. Mah
*Attorney, Agent, or Firm*—T. B. Gurin; J. J. Fry

[57] ABSTRACT

A magnetic resonance imager has a magnetically permeable core and two pole pieces, each pole piece having a face. The pole pieces are arranged on the core such that the pole piece faces are in opposed relationship forming a first gap therebetween. At least one of the pole pieces is comprised of an outer element 23 connected to the core and an inner element 24 connected between the outer element and the first gap. The outer element 23 forms a cup inside which the inner element 24 is disposed. A plurality of screws 11, 12 and 13 are disposed through the outer element 23 and engage the inner element 24 such that a second gap is formed between the inner and outer element. The homogeneity of the magnetic field in the first gap is affected by adjusting the position of the inner element relative to the outer element via screws 11, 12 and 13. The inner element being tiltable relative to the outer element by adjusting screws 12; moveable in the direction of its principal plane by adjusting screws 11; and formable into an arched surface by adjusting screws 13.

19 Claims, 1 Drawing Sheet

POLE PIECE FOR MR IMAGER

This application is a continuation, of application Ser. No. 08/297,981, filed Aug. 30, 1994, now abandoned.

BACKGROUND OF THE INVENTION

This invention relates to a pole piece design to generate very homogeneous magnetic field even with an asymmetric, open C-arm magnet to be used in medical magnetic resonance imaging equipment or MRI equipment.

In magnetic imagers with pole pieces it has been quite expensive to generate homogeneous magnetic flux inside a large enough imaging volume. It has normally required very symmetric structure for the magnet. U.S. Pat. No. 4,672,346 describes this kind of symmetric structures for a permanent magnet imager where the realization of homogeneity requires the movement of very large masses, at least the movement of the whole pole piece. U.S. Pat. No. 5,003,276 describes this kind of symmetric structure wherein a complex mechanism for shimming is done with tens of movable tuning pieces attached to both pole pieces. The inhomogeneity of an asymmetric structure is essentially larger than that of a symmetric structure and no working solution has been presented to achieve the required homogeneity of 20 ppm.

SUMMARY OF THE INVENTION

It is a characteristic of the invention that the pole piece is formed in such a way that there are annular parts, movable with respect of each other. The inner part of the pole piece can be transferred and tilted in such a way that a homogeneous magnetic field can be achieved in case of an asymmetric structure. The separate structure of the inner part makes lateral movement and tilting quick and exact so that better homogeneity is achieved over traditional solutions. The weight of the inner part can be considerably smaller than the total weight of the pole. This makes possible the optimization of the performance and cost during the selection of materials and the method of production.

An advantage of the present invention is that good homogeneity can be achieved effectively and economically.

Still other advantages will become apparent to others upon reading and understanding the following Detailed Description.

DETAILED DESCRIPTION OF THE PREFERRED EMBODIMENT

Figure 1A:
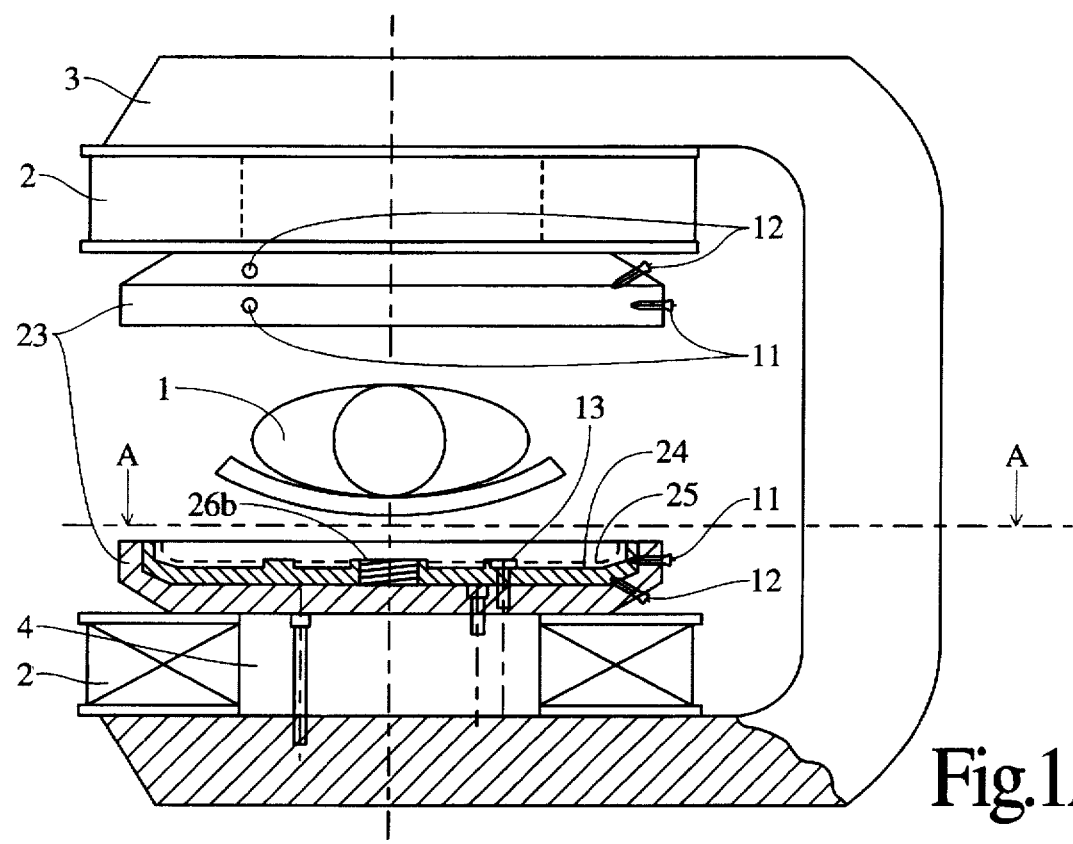
FIG. 1A is a side view of the MRI equipment with the pole pieces according to this invention.

FIG. 1A shows the equipment for patient imaging, in which the patient 1 is lying between pole pieces 23 (the inner part 24) in the magnetic field produced by current flowing in the coils 2. The necks 4 of the coils connect the pole pieces to the C-shaped body 3 of the magnet. These parts are made of iron and their function is to form the path for the return flux of the magnet. The invention is also suitable for magnet designs based on permanent magnet material. These differ only in the sense that in between body 3 and pole pieces 23 instead of coils 2 and the necks 4 permanent magnet material blocks are used.

Figure 1B:
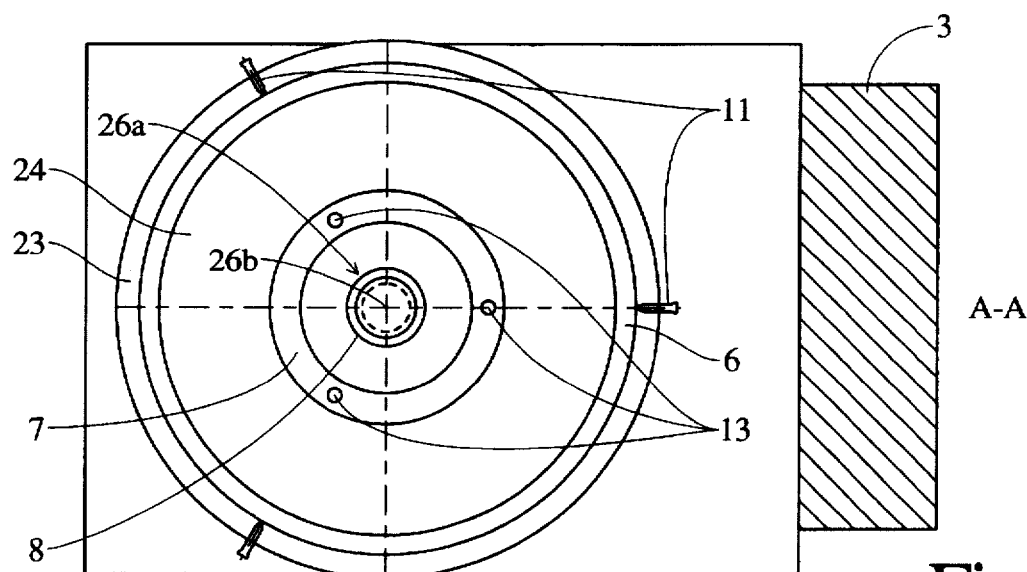
FIG. 1B is a view of the MRI equipment as viewed along cut line A—A in FIG. 1A.

To maximize the homogeneity of the magnetic field, shim rings 6, 7, 8 are concentrically arranged in an as-symmetric way, on the pole piece. Theoretical field calculations for a symmetric magnet indicates that extremely good, about 20 ppm (parts per million), homogeneity is achievable inside the imaging volume, when a pole piece having shim rings, as shown in FIGS. 1A and 1B, are used. The largest one of these rings 6, the first shim, forms the outer rim. The next one 7 is typically roughly one half radius of the former and the innermost one 8, i.e., center pole, is a bump on the pole. The calculations give numerous optimized results for the dimensions of these rings depending on the ratio of the outer diameter and the distance of the poles, with the optimized ratio being about two (2). In practice, the dimensions of the pole piece should be realized with accuracy of almost one hundredth of a millimeter. This accuracy of pole dimension is possible, however, it is difficult to align the big parts weighing almost one ton with the same accuracy. According to the present invention the pole piece is divided into two or more parts so that the outer part 23 forms a heavy cup inside which there is lighter and adjustable inner pole 24 defining the specific imaging properties. The outer part 23 carries the main part of the flux including the stray flux which is closing to the C-arm. The inner pole 24 can be tilted with screws 12 and can be moved in the direction of its principal plane with the screws 11. There can be more pairs of screws, but the desired effect is achievable with three pair of screws, 11 and 12. Measurements indicate that a sufficient range for adjustment is reached with less than a one millimeter air gap between the outer part and inner part.

The shape and the dimensions of the pole are the same as one constructed from a single piece. The ratio of the thickness of the outer part 23 to the inner part 24 is, for example, 2:1 so that the weight of the inner part will be about one-third of the total weight of the pole. The thickness of the inner part, however, can be considerably different, most suitably within the range of 10–40% from the total thickness of the pole. A reserve for half millimeter movement in the pole plane is typically sufficient to cancel the axial uncertainties in mounting the poles.

The unsymmetry of the magnetic flux density mused by the C-arm, because of forming a leakage path for the flux, is on the order of 1000 ppm. This, however, was compensated below 100 ppm by tilting the inner part 24 so that the pole gap or the distance to the opposite pole near the C-arm decreased about one millimeter. The homogeneity can then be compensated below a required level by attaching small iron pieces to the circumference of outer part 23. Additional fine tuning is possible by turning the tightening screws 13, used for attaching the inner part, so that the pole plate is stressed to form an arched surface. The number of tightening and adjusting screws is at least three of both, but it can be considerably larger. Other solutions for adjustment can also be applied. According to the invention, the inner part can be divided into two or more inner parts which are movable with respect of each other and are to be locked with screws after adjustment. Further, according to the invention, the one pole piece can be fixed or formed from a single part and the other adjustable. According to another embodiment of the invention the ratio between the performance and costs of the magnet can be optimized by selecting for the material of the inner part of the pole 24 more expensive iron alloy, for example with cobalt, nickel, or silicon alloyed iron in which the hysteresis and eddy current losses due to operation of the gradient coils located near the pole can be reduced. In addition, the inner part can be a laminated structure whose surface is comprised of an electrically weakly conducting ferromagnetic, formed plate 25 (shown In phantom in FIG. 1A). This surface part is preferable to insulate electrically or to form from a strip which is wound into a spiral in order to minimize the eddy currents.

The function of the outer cover of the pole by screws 11, as a massive piece, is to form the path for the advantageous flux and the stray flux over the coil and the C-arm. The part of this stray flux exceeds the flux through the inner pole, but the requirement for accuracy is smaller, meaning that the outer pole 23 can be manufactured from cheap iron by machining or economically by casting.

According to still another aspect of the invention, the center pole 8 contains an aperture 26a for receiving an inner part 26b. The position of the inner part is adjustable, relative to the aperture, in a direction along the thickness of the inner element 24. Magnetic field homogeneity is affected by adjusting the position of the inner part relative to the aperture.

The above invention has been described with reference to the preferred embodiments. Obvious modifications and combinations will occur to others upon reading and understanding the preceding description. It is intended that the invention be construed as including all such modifications, combinations and alterations insofar as they come within the scope of the appended claims or the equivalents hereof.

Having described the preferred embodiment the invention is now claimed to be:

1. A magnetic resonance imaging system comprising:
   a magnetically permeable core;
   two pole pieces, each pole piece having a face, said pole pieces disposed on said core such that the pole faces are in opposed relationship forming a first gap therebetween, at least one of said pole pieces being comprised of
   an outer ferromagnetic pole piece connected to the core and
   an inner ferromagnetic pole piece interposed between the outer pole piece and the first gap and connected to the outer pole piece said inner pole piece forming at least a portion of the face of said pole piece;
   means for producing a main magnetic field in the gap; and
   means for translating the inner pole piece relative to the outer pole piece in a direction along the principal plane of the inner pole piece.

2. The magnetic resonance imaging system set forth in claim 1 wherein the inner pole piece is tiltable relative to the outer pole piece.

3. The magnetic resonance imaging system set forth in claim 1 wherein the inner pole piece is curved relative to the outer pole piece.

4. The magnetic resonance imaging system set forth in claim 1 wherein the outer pole piece is comprised of a cavity in which the inner pole piece is disposed, said inner and outer pole pieces forming a second gap therebetween, the size of the second gap along a principal plane of the outer pole piece being adjustable by a first plurality of screws, the size of the second gap being adjustable in the direction along the thickness of the outer pole piece by a second plurality of screws and the curvature of the second gap being adjustable by a third plurality of screws.

5. The magnetic resonance imaging system set forth in claim 4 wherein the surface of the inner pole piece is comprised of at least two concentric shim rings and a center pole.

6. The magnetic resonance imaging system set forth in claim 5 wherein the center pole contains an aperture for receiving an inner part, said inner part adjustable relative to said center pole aperture in a direction along the thickness of the inner pole piece for adjusting the magnetic field homogeneity.

7. The magnetic resonance imaging system set forth in claim 4 wherein the second and third plurality of screws and includes at least three of each and using them the curvature of the surface of the inner pole piece is adjusted.

8. The magnetic resonance imaging system set forth in claim 5 wherein the second gap is suitably from 0.5 mm to 2 mm wide.

9. The magnetic resonance imaging system set forth in claim 4 wherein the weight ratio of the outer pole piece to the inner pole piece is in the range 1–10.

10. The magnetic resonance imaging system set forth in claim 1 wherein the inner pole piece is made of an iron alloy selected from a group consisting of cobalt, nickel, and silicon alloyed iron.

11. The magnetic resonance imaging system set forth in claim 1 wherein the face of the inner is comprised of a lamination of material having a higher resistivity than the remainder of the inner pole piece.

12. The magnetic resonance imaging system of claim 1 wherein the inner pole piece comprises a ferromagnetic material having hysteresis lower than that of the outer pole piece.

13. The magnetic resonance imaging system of claim 1 wherein the inner pole piece comprises a ferromagnetic material having eddy current losses lower than those of the outer pole piece.

14. A magnet for use in magnetic resonance imaging, the magnet comprising:
   a magnetically permeable core;
   two pole piece assemblies, each pole piece assembly having a face, said pole piece assemblies disposed on said core such that the pole faces are in opposed relationship forming first gap therebetween, at least one of said pole piece assemblies comprising
   a first ferromagnetic pole piece connected to the core and forming a cup having an inner face facing the first gap; and
   a second ferromagnetic pole piece movably mounted in the cup and covering substantially all of the inner face, the second pole piece forming at least a portion of the face of the pole piece;
   means for producing a main magnetic field in the gap; and
   means for translating the second pole piece within the cup in a direction along the principal plane of the inner pole piece.

15. The magnet of claim 14 wherein the second piece comprises a lamination of material having a higher resistivity than the remainder of the second pole piece.

16. The magnet of claim 14 wherein the second pole piece comprises a material having reduced hysteresis compared to the first pole piece.

17. A magnet for use in magnetic resonance imaging, the magnet comprising:
   a magnetically permeable core;
   two pole piece assemblies, each pole piece assembly having a face, said pole piece assemblies disposed on said core such that the pole faces are in opposed relationship forming first gap therebetween, at least one of said pole piece assemblies comprising
- a first ferromagnetic pole piece connected to the core and forming a cup having an inner face facing the first gap; and
- a second ferromagnetic pole piece movably mounted in the cup and having a weight approximately one-half the weight of the first pole piece, the second pole piece forming at least a portion of the face of the pole piece;

means for producing a main magnetic field in the gap; and means for translating the second pole piece within the cup in a direction along the principal plane of the inner pole piece.

18. The magnet of claim 14 wherein the second piece comprises a lamination of material having a higher resistivity than the remainder of the second piece.

19. The magnet of claim 14 wherein the second pole piece comprises a material having reduced hysteresis compared to the first pole piece.

* * * * *

UNITED STATES PATENT AND TRADEMARK OFFICE
CERTIFICATE OF CORRECTION

PATENT NO : 5,627,471
DATED : May 6, 1997
INVENTOR(S): Ilmari V. Kinanen

It is certified that error appears in the above-identified patent and that said Letters Patent is hereby corrected as shown below:

| Column | Line | |
|---|---|---|
| 1 | 67 | Change "as symmetric" to --axis-symmetric--. |
| 2 | 39 | Change "mused" to --caused--. |
| 4 | 24 | After "inner" insert --pole piece--. |
| 6 | 4 | Change "14" to --17--. |
| 6 | 7 | Change "14" to --17--. |

Signed and Sealed this

Twenty-ninth Day of July, 1997

Attest:

BRUCE LEHMAN

Attesting Officer    Commissioner of Patents and Trademarks